United States Patent
Oota

(10) Patent No.: US 11,151,709 B2
(45) Date of Patent: Oct. 19, 2021

(54) INSPECTION DEVICE AND INSPECTION METHOD

(71) Applicant: TOSHIBA MEMORY CORPORATION, Tokyo (JP)

(72) Inventor: Hiroshi Oota, Yokkaichi Mie (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 128 days.

(21) Appl. No.: 16/559,457

(22) Filed: Sep. 3, 2019

(65) Prior Publication Data
US 2020/0273158 A1 Aug. 27, 2020

(30) Foreign Application Priority Data
Feb. 22, 2019 (JP) .............................. JP2019-030746

(51) Int. Cl.
*G06T 7/00* (2017.01)
*G06T 7/62* (2017.01)
*H01L 21/67* (2006.01)

(52) U.S. Cl.
CPC .............. *G06T 7/0004* (2013.01); *G06T 7/62* (2017.01); *H01L 21/67253* (2013.01); *G06T 2207/20224* (2013.01); *G06T 2207/30148* (2013.01)

(58) Field of Classification Search
CPC ............ G06T 7/0004; G06T 7/62; G06T 2207/30148; G06T 2207/20224; H01L 21/67253; G01N 21/84; G01B 13/065; G01B 13/285; G01B 13/0608; G01C 11/04; G01F 23/00
See application file for complete search history.

(56) References Cited

U.S. PATENT DOCUMENTS

| | | | |
|---|---|---|---|
| 5,064,291 A * | 11/1991 | Reiser | G01N 21/95684 356/625 |
| 6,133,052 A | 10/2000 | Ichihara | |
| 6,259,038 B1 | 7/2001 | Sakaguchi et al. | |
| 2012/0092488 A1* | 4/2012 | Delaney | G01B 11/0608 348/128 |
| 2019/0348384 A1* | 11/2019 | Okuzono | G06T 7/60 |

FOREIGN PATENT DOCUMENTS

| | | |
|---|---|---|
| JP | 62-118596 A | 5/1987 |
| JP | 62118596 A * | 5/1987 |

* cited by examiner

*Primary Examiner* — Edward F Urban
*Assistant Examiner* — Wassim Mahrouka
(74) *Attorney, Agent, or Firm* — Foley & Lardner LLP

(57) ABSTRACT

According to one embodiment, an inspection device includes a stage on which a substrate having a protrusion portion on a surface thereof is mountable. A ring member presses an outer periphery of the substrate on the stage. A liquid supply unit supplies a liquid on the surface of the substrate from the surface thereof to a first height. An imaging unit captures an image of a surface of the liquid and the protrusion portion from above the surface of the substrate. An arithmetic operation unit determines a size of an exposed portion of the protrusion portion which is exposed from the surface of the liquid by using the image obtained from the imaging unit, and determines a height of the protrusion portion on the basis of the size of the exposed portion.

16 Claims, 6 Drawing Sheets

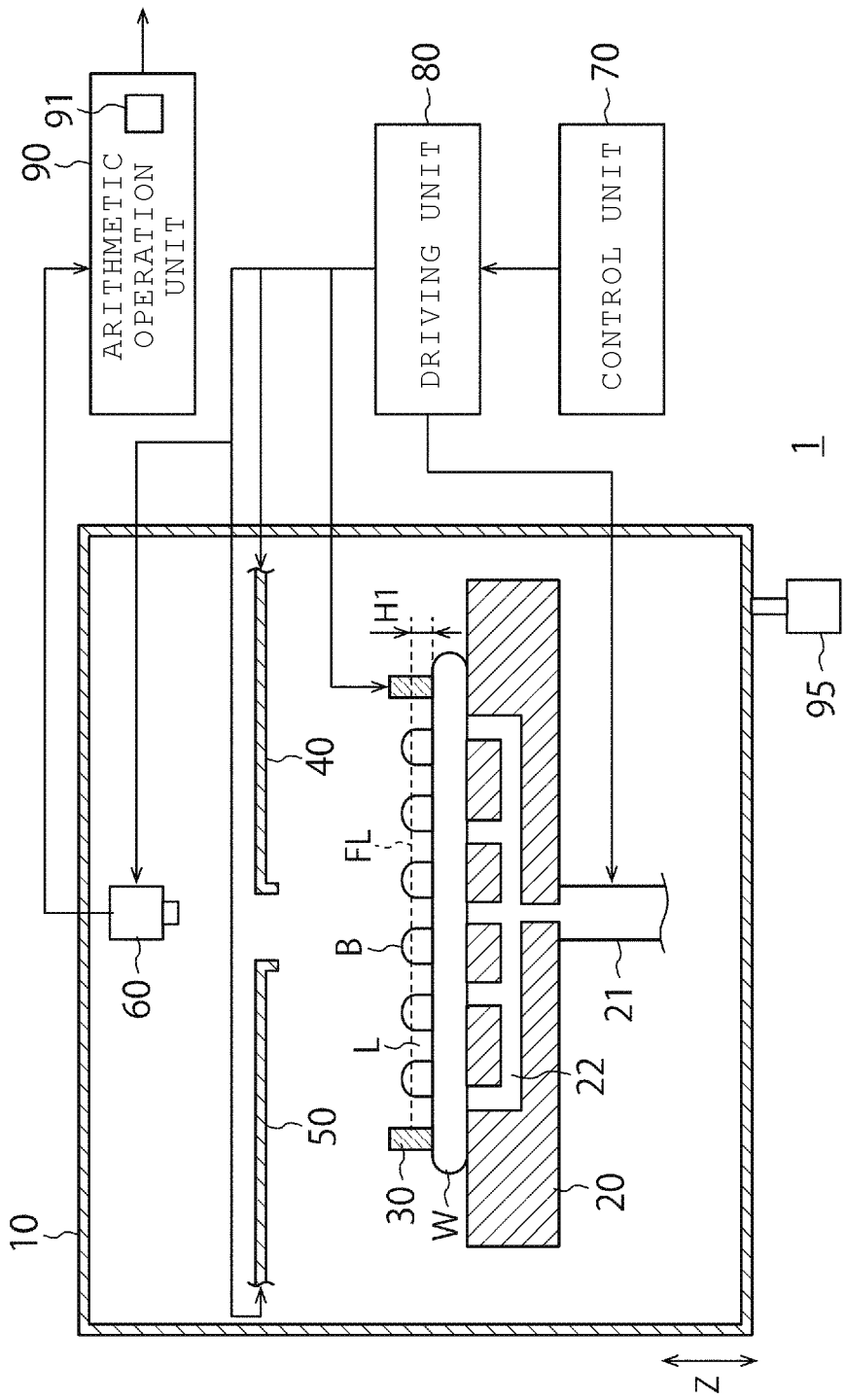

INSPECTION DEVICE AND INSPECTION METHOD

CROSS-REFERENCE TO RELATED APPLICATION(S)

This application is based upon and claims the benefit of priority from. Japanese Patent Application No. 2019-030746, filed Feb. 22, 2019, the entire contents of which are incorporated herein by reference.

FIELD

Embodiments described herein relate generally to an inspection device and an inspection method.

BACKGROUND

In recent years, in a semiconductor manufacturing process, semiconductor inspection devices that measure the height of irregularities of a surface structure such as a bump use methods such as a confocal system, a triangulation system, and a white interference system. However, in these systems, it is necessary to detect reflected light while shifting a focal position or the position of irradiation light, which can take a long time to measure the heights of a large number of bumps and the like.

Examples of related art include JP-A-62-118596, JP-A-2000-040867, and JP-A-10-242219.

DESCRIPTION OF THE DRAWINGS

FIG. 1 is a schematic view showing a configuration example of an inspection device according to a first embodiment;

DETAILED DESCRIPTION

Figure 2A:
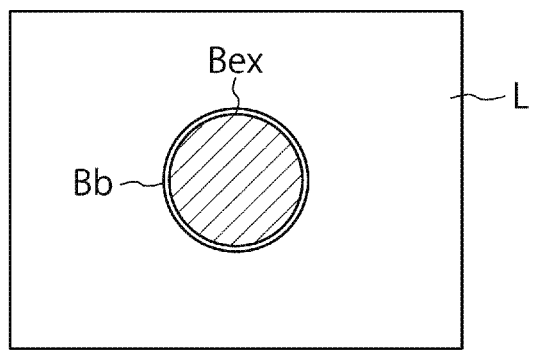
FIGS. 2A and 2B are conceptual views showing a relationship between an exposed portion of a bump and the height of the bump.

Embodiments provide an inspection device and an inspection method for measuring the height of a surface structure in a short period of time.

In general, according to one embodiment, there is provided an inspection device including a stage configured to mount a substrate, a ring member configured to secure an outer periphery of the substrate on the stage, a nozzle configured to supply a liquid on the surface of the substrate to reach a first height that causes a portion of the protrusion feature of the substrate to be exposed, an imaging unit configured to capture an image including of the liquid and the exposed portion of the protrusion feature of the substrate, and an arithmetic operator configured to determine a size of the exposed portion of the protrusion feature using the image, and determine a height of the protrusion feature based on the determined size of the exposed portion of the protrusion feature.

Hereinafter, embodiments of the present disclosure will be described with reference to the accompanying drawings. The embodiments do not limit the present disclosure. The drawings are schematic or conceptual, and the proportions of respective portions are not necessarily the same as the actual values thereof. In the specification and the drawings, the same components as those described with regard to the previous drawings will be denoted by the same reference numerals and signs, and detailed description thereof will be omitted as appropriate.

First Embodiment

FIG. 1 is a schematic view showing a configuration example of an inspection device according to a first embodiment. An inspection device 1 according to the present embodiment is a semiconductor inspection device that measures heights of a large number of bumps B formed on a semiconductor substrate W. The inspection device 1 includes a chamber 10, a stage 20, a seal ring 30, a liquid nozzle 40, a cleaning nozzle 50, a camera 60, a control unit (or controller) 70, a driving unit (or driver) 80, and an arithmetic operation unit (or arithmetic operator) 90.

The chamber 10 accommodates the stage 20, the seal ring 30, the nozzles 40 and 50, and the camera 60, and the inside thereof may be evacuated by a vacuum pump 95. The substrate W can be mounted on the stage 20 substantially horizontally, and the stage 20 can adsorb the substrate W using an electrostatic chuck or a vacuum chuck. For example, the substrate W may be adsorbed into the surface of the stage 20 through suction between the substrate W and the surface of the stage 20 which is performed by a suction route 22 provided in the stage 20. The stage 20 adsorbs the substrate W, and thus the substrate W may be corrected on the stage 20 substantially flatly even when the substrate W is distorted to a certain extent. The stage 20 is supported by a shaft 21 and is configured to be rotatable around the shaft 21.

The seal ring 30 as a ring member is configured to be movable on the surface of the stage 20 in substantially a vertical direction (Z-direction). After the substrate W is mounted on the stage 20, the seal ring 30 descends toward the substrate W and presses the outer periphery of the substrate W. As the seal ring 30 presses the outer periphery of the substrate W, a space between the seal ring 30 and the substrate W is sealed in a liquid-tight state, and a liquid can be collected on the surface of the substrate W inside the seal ring 30. The height (thickness) of the seal ring 30 in the Z-direction is larger than that of the bump B in the Z-direction. For example, a resin or the like which does not allow a liquid such as silicone to pass therethrough and can be brought into close contact with the substrate W is used for the seal ring 30. In addition, when the seal ring 30 and the substrate W are brought into close contact with each other, the stage 20 may be ascended in the Z-direction, and the substrate W may be brought into close contact with the seal ring 30.

The substrate W is a semiconductor wafer including a semiconductor element such as a NAND-type flash memory. One semiconductor chip is formed at a plurality of locations on the surface of the semiconductor wafer. One semiconductor chip has a large number of bumps B as protrusion portions (or protrusion features) on the surface. The bumps B are respectively connected to corresponding electrodes (not shown) of another semiconductor chip or a mounting substrate in a case of flip-chip connection to the other semiconductor chip or mounting on the mounting substrate. Therefore, it is preferable that heights of the bumps B fall within a predetermined range from the surface of the substrate W. This is because there is a concern that a failure in connection (an opening or a short-circuit) between the bumps B and the electrodes of the other semiconductor chip or the mounting substrate may occur when the heights of the bumps B do not fall within the predetermined range. Therefore, it is important to measure the heights of the bumps B and determine whether or not the heights fall within the predetermined range.

The liquid nozzle 40 as a liquid supply unit supplies a liquid L on the surface of the substrate W which is being pressed by the seal ring 30. Since the seal ring 30 is brought into close contact with the outer edge of the substrate W, the liquid L is collected on the substrate W inside the seal ring 30. The liquid nozzle 40 supplies a predetermined amount of liquid so that a liquid level FL of the liquid L reaches a predetermined first height H1 from the surface of the substrate W. The first height H1 is above the surface of the substrate W and is set to be a position lower than the height of an upper end of a normal bump B and the height of an upper end of the seal ring 30. The amount of liquid L supplied from the liquid nozzle 40 is set in advance so that the liquid level FL reaches the first height H1 and is stored in a memory 91 within the arithmetic operation unit 90. The liquid nozzle 40 supplies the predetermined amount of liquid whenever the substrate W is measured. In this case, the first height H1 is lower the tip of the bump B, and thus the tip portion of the bump B protrudes from the liquid level FL of the liquid L. In addition, the bump B has a solder ball at the tip thereof and has substantially a spherical form or a sharply pointed form. When the bump B has a desired height, a predetermined amount of the liquid L is adjusted so that the liquid level FL of the liquid L is positioned at a portion of substantially the spherical form or the sharply pointed form of the tip of the bump B. Therefore, a two-dimensional size (area) of the bump B exposed from the liquid level FL of the liquid L, when seen from the top of the surface of the substrate W, changes in accordance with the height of the bump B. The inspection device 1 according to the present embodiment determines the height of the bump B by measuring the area of the bump B exposed from the liquid level FL with the liquid level FL of the liquid L as a reference surface. The determination of the height of the bump B will be described later in detail.

The liquid L is a liquid that does not react with the substrate W, the bump B, and the seal ring 30 and may be, for example, water, an organic solvent, or the like. When the chamber 10 is evacuated, an organic solvent with a high boiling point, or the like is preferably used. In addition, the liquid L has different color attributes for the bump B and the surface of the substrate W so that the camera 60 and the arithmetic operation unit 90 can discriminate the liquid L, the bump B, and the surface of the substrate W from one another. The attribute of the color may be any of hue, saturation, and brightness as long as the arithmetic operation unit 90 can discriminate an image captured by the camera 60. For example, the liquid L may be a liquid with low brightness with respect to the bump B and the surface of the substrate W. In this case, the arithmetic operation unit 90 can discriminate the bump B from the liquid L by using a difference in contrast between the liquid L and the bump B. Thereby, the arithmetic operation unit 90 can arithmetically operate a two-dimensional area of a portion (exposed portion) of the bump B which is exposed from the liquid L by using a two-dimensional image obtained from the camera 60.

In some embodiments, the bump B has a liquid repellent property with respect to the liquid L. Therefore, the liquid L is prevented from covering the side surface of the bump B to a position higher than the first height H1 due to surface tension, and the liquid level FL (reference surface) of the liquid L is maintained at the first height H1. The liquid level FL is maintained at the first height H1, and thus the arithmetic operation unit 90 can accurately determine the size of the exposed portion of the bump B.

The camera 60 as an imaging unit captures an image of the liquid level FL of the liquid L and the bump B from above the surface of the substrate W (Z-direction). Thereby, the camera 60 can capture a planar image (e.g., a two-dimensional image) of the liquid level FL of the liquid L and the bump B. The camera 60 may be a complementary metal-oxide-semiconductor (CMOS) sensor, a charge-coupled device (CCD) sensor, or the like. Image data obtained from the camera 60 is transmitted to the arithmetic operation unit 90.

The arithmetic operation unit 90 determines the size of the exposed portion of the bump B which is exposed from the liquid level FL of the liquid L using the image data obtained from the camera 60. The size of the exposed portion may be referred to as an area or a diameter of a two-dimensional region in a planar image of the exposed portion when seen from above the substrate W. In the present embodiment, the size of an exposed portion is determined using an area of a planar image. The arithmetic operation unit 90 discriminates the liquid L and the bump B from each other on the basis of, for example, brightness of an image and calculates the number of pixels of the camera 60 detecting the bump B. Since the number of pixels corresponds to an area in a planar image, the arithmetic operation unit 90 can determine an area of an exposed portion of the bump B by calculating the number of pixels for detecting the bump B.

Further, the area of the exposed portion of the bump B corresponds to the height of the bump B as described above. Therefore, consequently, the number of pixels for imaging the bump B corresponds to the height of the bump B, and it is possible to determine whether or not the height of the bump B is appropriate by obtaining the number of pixels of the bump B. It may be said that the shape and size of the solder ball at the tip portion of the bump B are stable compared to the height of the bump, and the number of pixels of the bump B corresponds to the height of the bump B. Therefore, the arithmetic operation unit 90 may perform determination on the basis of whether or not the number of pixels of the bump B falls within a predetermined range. An upper limit value and a lower limit value of the number of pixels is set in advance and stored in the memory 91.

The cleaning nozzle 50 supplies a cleaning fluid to the substrate W after the inspection of the bump B to clean the surface of the substrate W. After inspecting the bump B, the seal ring 30 is removed from the surface of the substrate W. In addition, the cleaning nozzle 50 supplies a cleaning fluid to the substrate W while the stage 20 rotates the substrate W. Thereby, the inspection device 1 can clean the substrate W after inspecting the bump B. After cleaning the substrate W, the stage 20 spins the substrate W at high speed to spin-dry the substrate.

The control unit 70 controls the driving unit 80 and other components. The driving unit 80 drives the stage 20, the seal ring 30, the liquid nozzle 40, the cleaning nozzle 50, and the camera 60 under the control of the control unit 70. For example, the driving unit 80 drives the vacuum chuck or the electrostatic chuck of the stage 20 and rotates and moves the stage 20 vertically. Alternatively, the driving unit 80 moves the seal ring 30 vertically in the Z-direction. Alternatively, the driving unit 80 ejects a liquid or a cleaning agent from the liquid nozzle 40 and the cleaning nozzle 50. In addition, the control unit 70 and the driving unit 80 are collectively shown in the drawing, but may be individually provided for each of the stage 20, the seal ring 30, the liquid nozzle 40, the cleaning nozzle 50, and the camera 60.

Figure 2B:
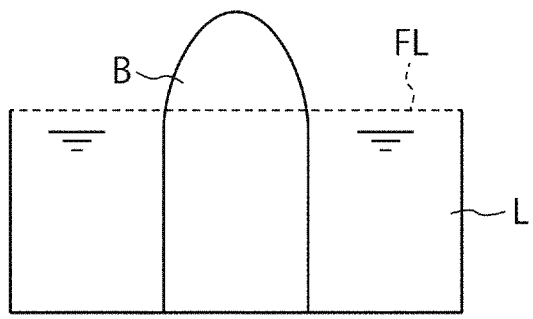
Figure 3A:
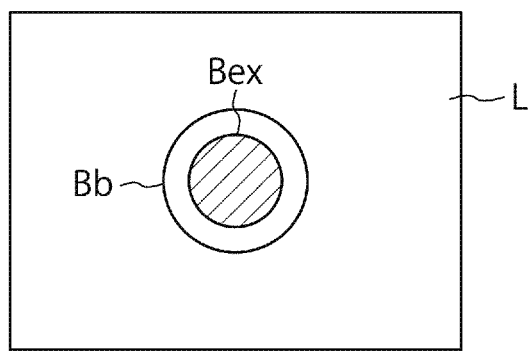
FIGS. 3A and 3B are conceptual views showing a relationship between an exposed portion of a bump and the height of the bump.
Figure 3B:
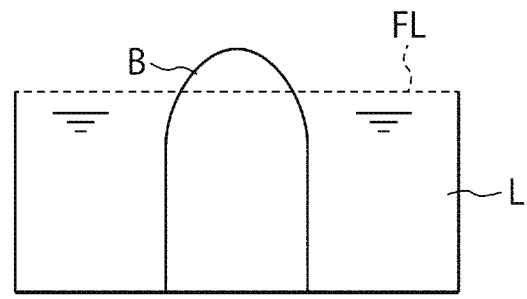
Figure 4A:
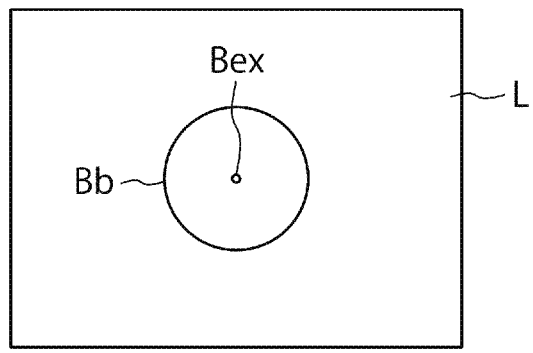
FIGS. 4A and 4B are conceptual views showing a relationship between an exposed portion of a bump and the height of the bump.
Figure 4B:
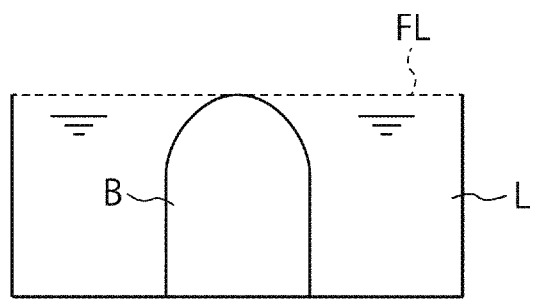

FIGS. 2A to 4B are conceptual views showing a relationship between an exposed portion of the bump B and the height of the bump B. FIGS. 2A, 3A, and 4A are plan views when the bump B is seen from the top of the surface of the substrate W (Z-direction) in a state where the liquid L is collected on the surface of the substrate W in the inspection device 1. That is, FIGS. 2A, 3A, and 4A are planar images of the bump B which are captured by the camera 60. FIGS. 2B, 3B, and 4B are corresponding side views of the bump B when seen from the side of the substrate W in the same state. Further, in FIGS. 2A to 4B, only one bump B is shown, but any number of the bumps B can be provided on the substrate W.

In FIGS. 2A and 2B, the height of the bump B is high, and the tip of the bump B greatly protrudes from the liquid level FL of the liquid L (reference surface). In this case, as shown in FIG. 2A, an outer edge of an exposed portion Bex of the bump B is closer to an outer edge of a bottom portion Bb of the bump B. Since the exposed portion Bex of the bump B is large, the number of pixels of the exposed portion Bex is relatively large in the planar image obtained from the camera 60. For example, when the number of pixels of the exposed portion Bex exceeds an upper limit value which is set in advance, the arithmetic operation unit 90 determines that the bump B is too high and determines that the bump B is defective.

In FIGS. 3A and 3B, the height of the bump B is appropriate, and the tip of the bump B is exposed from the liquid level FL of the liquid L to a certain extent. In this case, as shown in FIG. 3A, the outer edge of the exposed portion Bex of the bump B is on the inner side of the bottom portion Bb of the bump B and has a margin for the bottom portion Bb. Since the exposed portion Bex of the bump B has an appropriate size, the number of pixels of the exposed portion Bex also falls within a predetermined range in a planar image obtained from the camera 60. In this case, the arithmetic operation unit 90 determines that the height of the bump B is appropriate and determines that the bump B is non-defective.

In FIGS. 4A and 4B, the height of the bump B is low, and the tip of the bump B hardly protrudes from the liquid level FL of the liquid L. In this case, as shown in FIG. 4A, the exposed portion Bex of the bump B is significantly small or there is no exposed portion, and thus the number of pixels of the exposed portion Bex is too small in a planar image obtained from the camera 60. For example, when the number of pixels of the exposed portion Bex is less than a lower limit value which is set in advance, the arithmetic operation unit 90 determines that the bump B is too low and determines that the bump B is defective.

In this manner, the arithmetic operation unit 90 determines the height of the bump B according to whether or not the number of pixels of the exposed portion Bex of the bump B falls within a predetermined range which is set in advance by using a planar image obtained from the camera 60. When the number of pixels of the exposed portion Bex falls within the predetermined range, the arithmetic operation unit 90 determines that the height of the bump B is appropriate. When the number of pixels of the exposed portion Bex does not fall within the predetermined range, the arithmetic operation unit 90 determines that the height of the bump B is too high or too low. In this case, it is determined that the bump B is defective. A predetermined range of the number of pixels for determining whether or not the bump B is defective can be changed in accordance with the amount of liquid L supplied, that is, the setting of the height H1 of the liquid level FL (reference surface).

According to the present embodiment, a step of pressing the substrate W by the seal ring 30 and a step of supplying the liquid L are added. However, it is sufficient for the camera 60 to capture a planar image of the substrate W once, and it is not necessary to change a focal position and to consecutively capture an image while shifting an imaging position. In order to measure the height of the bump B using a method such as a confocal system, a triangulation system, or a white interference system, one hour to several tens of hours are required. On the other hand, according to the inspection device 1 of the present embodiment, it is sufficient to determine the height of the bump B for approximately five minutes. Therefore, the inspection device 1 according to the present embodiment can greatly reduce an inspection time for the bump B as a whole.

Next, an inspection method according to the present embodiment will be described.

Figure 5A:
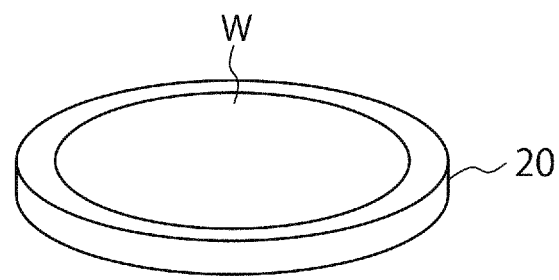
FIGS. 5A and 5B are conceptual views showing an example of an inspection method according to the first embodiment.

FIG. 5A to FIG. 8 are conceptual views showing an example of an inspection method according to the first embodiment. First, as shown in FIG. 5A, the substrate W is mounted on the stage 20. The stage 20 adsorbs the substrate W using a vacuum chuck or an electrostatic chuck.

Figure 5B:
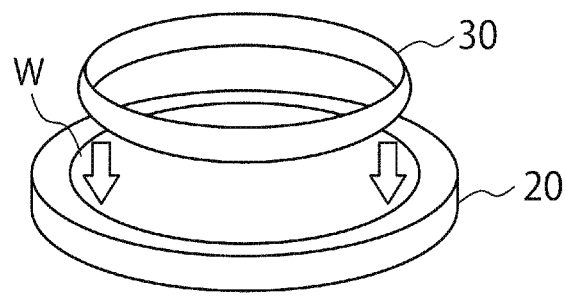
Figure 6A:
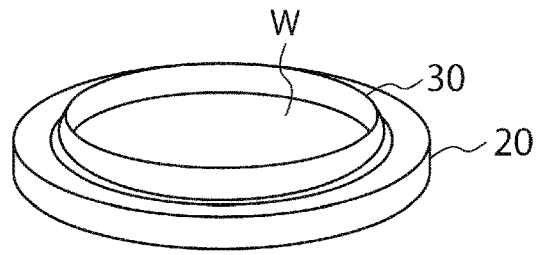
FIGS. 6A and 6B are conceptual views showing an example of the inspection method subsequent to FIGS. 5A and 5B.

Next, as shown in FIG. 5B, the seal ring 30 is brought into contact with an outer edge of the substrate W. As shown in FIG. 6A, the outer edge of the substrate W is pressed by the seal ring 30. Thereby, a space between the seal ring 30 and the substrate W is sealed in a liquid-tight manner.

Figure 6B:
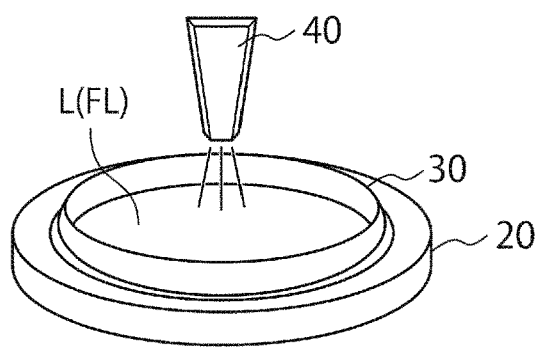

Next, as shown in FIG. 6B, the liquid nozzle 40 supplies the liquid L into the seal ring 30 and collects the liquid L on the surface of the substrate W. The liquid nozzle 40 ejects a predetermined amount of liquid L. Thereby, the liquid L is collected to the first height H1 from the surface of the substrate W. In this manner, the liquid level FL of the liquid L is set to the first height H1 so as to expose an upper end of the bump B on the substrate W. The liquid level FL of the liquid L in this case serves as a reference surface for detecting the exposed portion of the bump B. The bump B is not shown in FIG. 5A to FIG. 8.

Figure 7A:
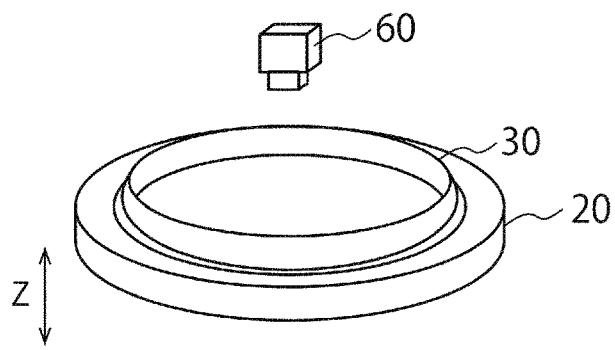
FIGS. 7A and 7B are conceptual views showing an example of the inspection method subsequent to FIGS. 5A and 5B.

Next, as shown in FIG. 7A, an image of the surface of the substrate W is captured by the camera 60 from above the surface of the substrate W (Z-direction). Thereby, an image of the upper end of the bump B which is exposed from the liquid level FL of the liquid L as a reference surface is captured. The arithmetic operation unit 90 determines the height of the bump B from the image of the camera 60 and determines whether or not the bump B is defective. A method of determining the height of the bump B will be described later with reference to FIG. 9.

Figure 7B:
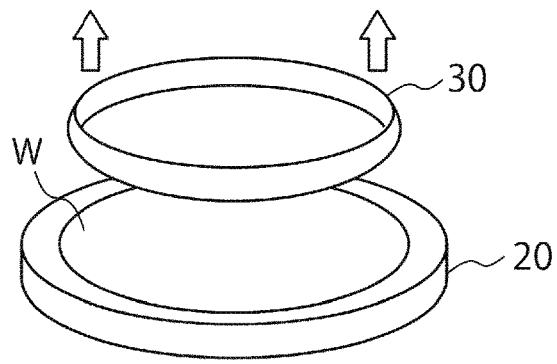
Figure 8:
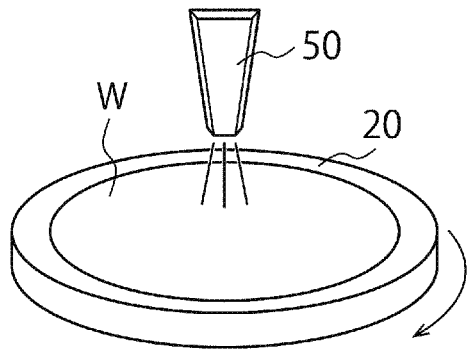
FIG. 8 is a conceptual view showing an example of the inspection method subsequent to FIGS. 5A and 5B.

Next, as shown in FIG. 7B, the seal ring 30 is removed from an end of the substrate W. Next, as shown in FIG. 8, the cleaning nozzle 50 supplies a cleaning fluid on the substrate W. The cleaning fluid washes away the liquid L on the substrate W. The cleaning fluid may be, for example, clear pure water. In this case, the stage 20 rotates the substrate W to eliminate the cleaning fluid. After cleaning the substrate W, the stage 20 further rotates the substrate W to spin-dry the substrate.

Thereafter, the substrate W is carried out of the chamber 10. Thereby, an inspection process for the substrate W is terminated.

Figure 9:
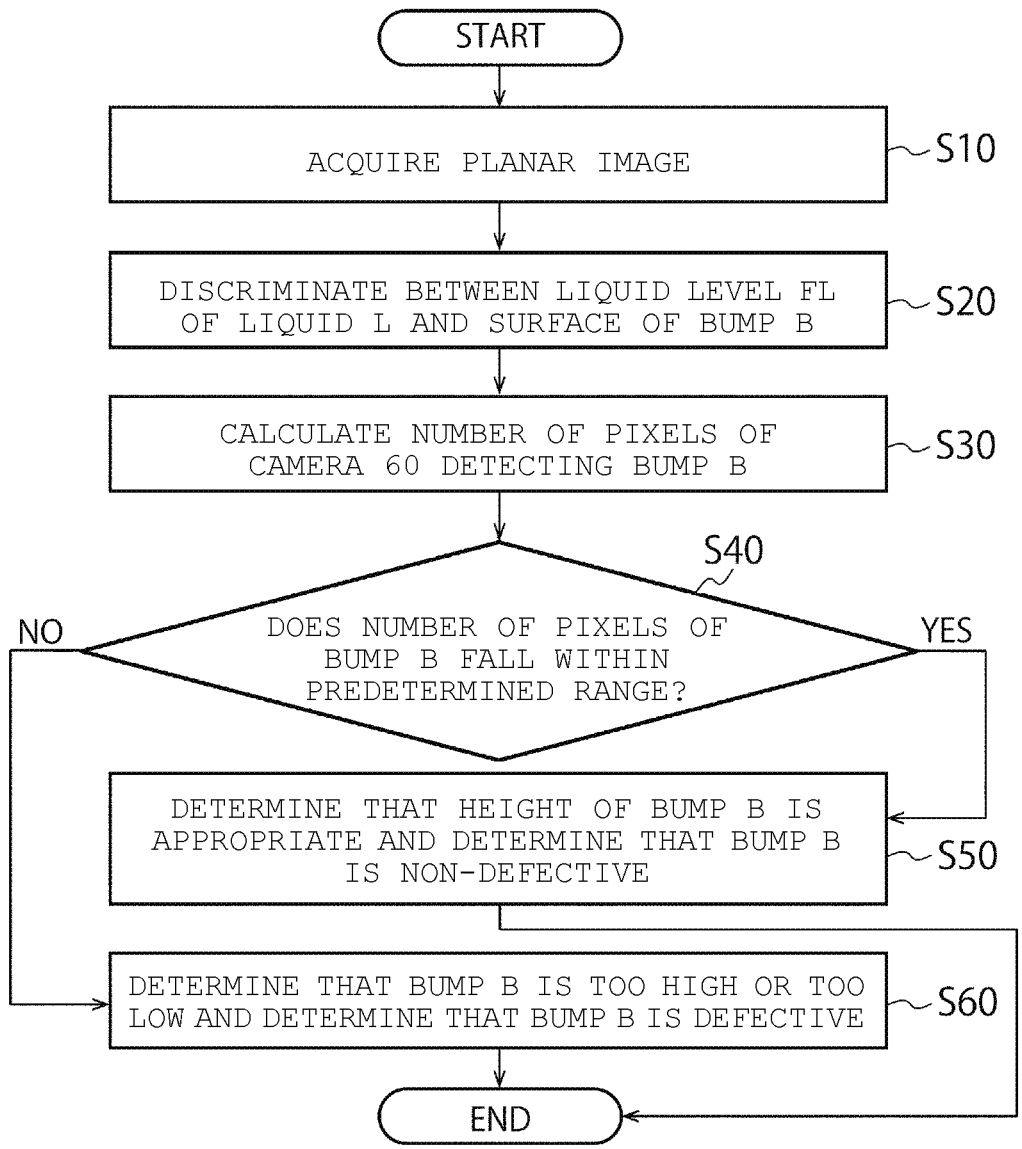
FIG. 9 is a flow diagram showing a method of determining the height of a bump.

FIG. 9 is a flow diagram showing a method of determining the height of the bump B. The arithmetic operation unit 90 acquires a planar image from the camera 60 (S10). Next, the arithmetic operation unit 90 discriminates the liquid level FL of the liquid L and the surface of the bump B from each other on the basis of, for example, the contrast of an image (S20). The discrimination is executed on the basis of a difference in the attribute (hue, saturation, or brightness) of color. For example, the arithmetic operation unit 90 discriminates the bump B from the liquid L by using a difference in contrast between the liquid L and the bump B.

Further, after discriminating the liquid L from the bump B on the basis of the contrast of the image, the arithmetic operation unit 90 calculates the number of pixels of the camera 60 detecting the bump B (S30). The arithmetic operation unit 90 can determine an area of an exposed portion of the bump B by calculating the number of pixels for detecting the bump B.

Next, the arithmetic operation unit 90 determines whether or not the number of pixels of the bump B falls within a predetermined range (S40). When the number of pixels falls within the predetermined range (YES in S40), the arithmetic operation unit 90 determines that the height of the bump B is appropriate and determines that the bump B is non-defective (S50). When the number of pixels does not fall within the predetermined range (NO in S40), the arithmetic operation unit 90 determines that the bump B is too high or too low and determines that the bump B is defective (S60).

When even one of the large number of bumps B is defective, there is a strong possibility that a failure in connection to another semiconductor chip or a mounting substrate may be caused. Therefore, it is determined that such a semiconductor chip is defective.

In this manner, according to the present embodiment, it is possible to inspect the height of the bump B with one still planar image. Thereby, it is possible to reduce an inspection time for the bump B. The inspection of the bump B shown in FIG. 9 may be performed on the entire substrate W at once or may be performed for each portion of the substrate W (for example, for each semiconductor chip). When the substrate W is inspected at once, imaging can be performed only once by the camera 60, which leads to a reduction in an inspection time. On the other hand, when the substrate is inspected for each semiconductor chip, the number of pixels for capturing an image of one bump B is increased, and thus the inspection device 1 can more accurately determine the height of the bump B. Alternatively, an image of the bump B may be further captured and inspected for each portion of a semiconductor chip. In this case, the inspection device 1 can further accurately determine the height of the bump B.

When a plurality of locations of the substrate W are inspected, the substrate W may be stopped and the camera 60 may be moved, the camera 60 may be stopped and the substrate W may be moved, or the substrate W and the camera 60 may be simultaneously moved.

In addition, when the chamber 10 is evacuated, there is no influence of air fluctuation or the like, and thus it is possible to perform inspection more accurately.

Second Embodiment

Figure 10:
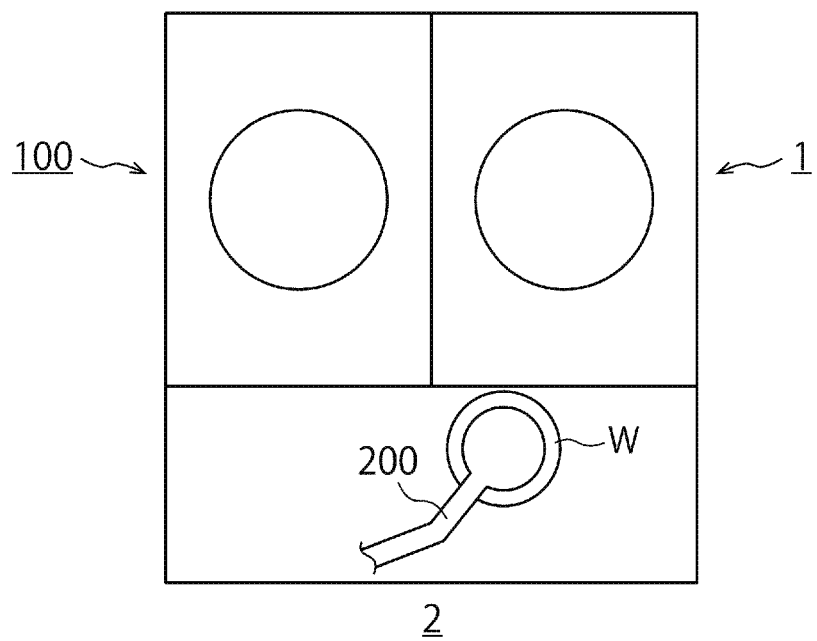
FIG. 10 is a schematic view showing a configuration example of an inspection device according to a second embodiment.

FIG. 10 is a schematic view showing a configuration example of an inspection device 2 according to a second embodiment. In the first embodiment, the height of the bump B is determined using the liquid level FL of the liquid L as a reference surface. On the other hand, according to the second embodiment, a film FM is attached on the surface of a substrate W, and the height of a bump B is determined using an upper surface FF of the film FM as a reference surface.

An inspection device 2 shown in FIG. 10 further includes a film attachment mechanism 100 and a carrying robot 200, in addition to the inspection device 1 shown in FIG. 1. A configuration of the film attachment mechanism 100 will be described later with reference to FIG. 11. The carrying robot 200 is a robot arm that transports the substrate W between the inspection device 1 and the film attachment mechanism 100. In addition, the carrying robot 200 carries the substrate W between the inspection device 1 and a wafer cassette or between the film attachment mechanism 100 and the wafer cassette.

Figure 11:
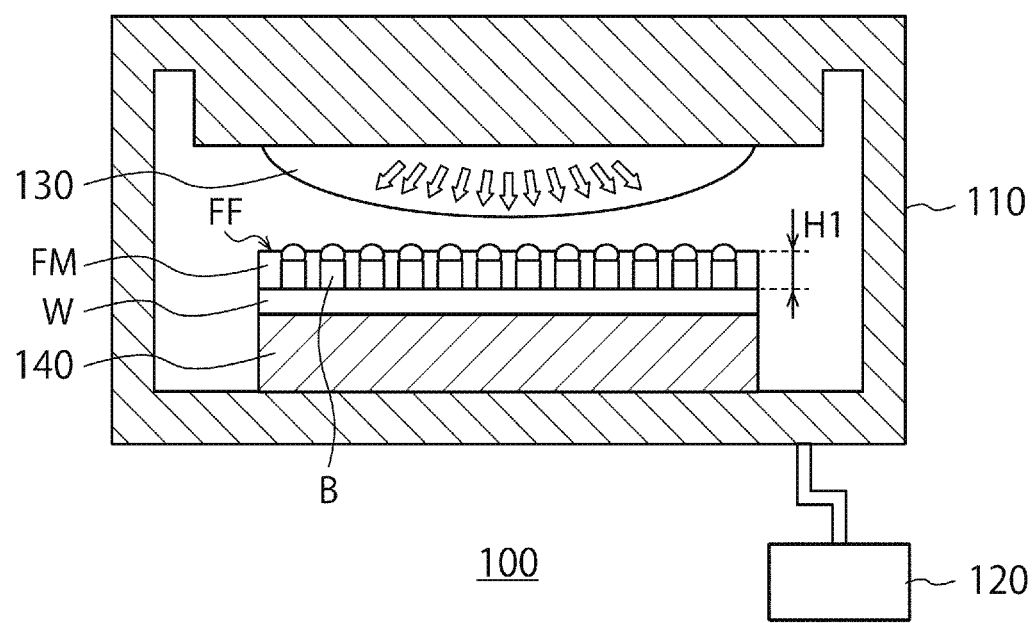
FIG. 11 is a schematic view showing a configuration example of a film attachment mechanism.

FIG. 11 is a schematic view showing a configuration example of the film attachment mechanism 100. The film attachment mechanism 100 as an attachment unit includes a chamber 110, a vacuum pump 120, a diaphragm 130, and a stage 140.

The chamber 110 is evacuated by the vacuum pump 120 and accommodates the stage 140 and the diaphragm 130. In addition, the substrate W is mounted on the stage 140 inside the chamber 110, and the film FM can be attached onto the substrate W.

As indicated by an arrow in FIG. 11, the diaphragm 130 expands toward the substrate W due to evacuation occurring inside the chamber 110 and a gas flowing into the diaphragm on a side opposite to the substrate W. By further continuously evacuating the chamber 110, the diaphragm 130 presses the film FM toward the surface of the substrate W, brings the film FM into close contact with the surface of the substrate W, and makes upper ends of the bumps B protrude from the film FM. The film FM sufficiently brings the film FM into close contact with the surface of the substrate W so that a gas (void) does not remain between the film FM and the substrate W. Thereafter, the operation of the vacuum pump 120 is stopped, and the diaphragm 130 is separated from the film FM and the substrate W. In this case, a gas in the diaphragm 130 on the side opposite to the substrate W may be discharged by the vacuum pump 120. After separating the diaphragm 130, the upper surface FF of the film FM on the surface of the substrate W is set to a first height H1 from the surface of the substrate W. That is, in the second embodiment, the film FM is attached onto the surface of the substrate W inside the chamber 10 and is pressurized so that the bumps B penetrate the film FM. While pressurizing the film FM, the thickness of the film FM is set so that the upper surface FF of the film FM is set to the first height H1.

A flexible resin material (for example, an epoxy-based resin film) capable of being penetrated by the bumps B is used for the film FM. The film FM has a thickness from the surface of the substrate W to the first height H1. In addition, the film FM has different color attributes (for example, hue, saturation, or brightness) for the bump B and the surface of the substrate W so that the camera 60 and the arithmetic operation unit 90 can discriminate among the film FM, the bump B, and the surface of the substrate W. For example, the film FM may be a resin with low brightness for the bump B and the surface of the substrate W.

Thereafter, the substrate W having the film FM attached thereto is carried from the film attachment mechanism 100 shown in FIG. 10 to the inspection device 1. That is, the carrying robot 200 carries the substrate W from the chamber 110 of the film attachment mechanism 100 to the chamber 10 of the inspection device 1.

A method of determining the height of the bump B according to the second embodiment may be the same as that in the first embodiment. That is, similarly to the first embodiment, the inspection device 1 determines the size of an exposed portion of the bump B which is exposed from the surface of the film FM by using a two-dimensional image obtained from the camera 60 and determines the height of the bump B on the basis of the size of the exposed portion. The arithmetic operation unit 90 determines an area of the exposed portion of the bump B on the basis of a difference in the attribute (for example, hue, saturation, or brightness) between the film FM and the bump B. In this case, the arithmetic operation unit 90 determines an area of the exposed portion on the basis of the number of pixels of the camera 60 that captures an image of the bump B. Since the area of the exposed portion of the bump B corresponds to the height of the bump B, the arithmetic operation unit 90 can determine whether or not the height of the bump B is appropriate from the number of pixels of the exposed portion of the bump B. Thereafter, the film FM is peeled off inside or outside the chamber 10. In this manner, the height of the bump B can also be determined using the film FM instead of the liquid L. That is, in the second embodiment, it is possible to obtain the same effects as those in the first embodiment.

In the second embodiment, the film FM is used instead of the liquid L, and thus the liquid nozzle 40 and the cleaning nozzle 50 of the inspection device 1 shown in FIG. 1 may be omitted.

In the second embodiment, the chamber 110 of the film attachment mechanism 100 may be provided separately from the chamber 10 of the inspection device 1. However, the chamber 110 and the chamber 10 may be shared. In this case, the diaphragm 130 and the camera 60 are required to be disposed inside the same chamber. For this reason, the stage 20 may be able to move the substrate W inside the chamber so that the diaphragm 130 and the camera 60 do not interfere with each other.

Alternatively, a driving unit 80 may be able to move the diaphragm 130 or the camera 60. Thereby, the diaphragm 130 and the camera 60 can be prevented from coming into contact with each other in a step of attaching the film FM and a step of imaging the bump B.

In addition, the film FM after bump measurement may be dissolved using an organic solvent and peeled off.

Alternatively, a portion may be peeled off so as to be pinched off. Thereafter, the substrate W may be cleaned. In this case, the inspection device 1 may include the cleaning nozzle 50.

At least a part of the height determination method and unit (e.g., the arithmetic operation unit 90) according to the embodiment may be implemented by hardware or software. As for hardware, it may be a circuit (e.g., circuitry of a CPU, GPU, FPGA or other processing circuits implemented using electronic circuits), or a processor (e.g., CPU, GPU and the like) with a memory configured to implement the identified components herein. When software is used, a program which achieves at least some of functions of the height determination method is stored in a recording medium such as a flexible disk, CD-ROM, ROM, RAM, flash memory, DVD-ROM, Blu-Ray® discs, and may be read and executed by a computer. The recording medium is not limited to a removable recording medium such as a magnetic disk or an optical disk, and may also be a fixed type recording medium such as a hard disk device or a memory. Further, the program which achieves at least some of the functions of the measurement method may be distributed via a communication line (including wireless communication) such as the Internet or the like. Still further, the program may be distributed via a wired line or a wireless line such as the Internet or distributed after being stored in a state where the same program is encrypted, modulated, or compressed While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An inspection device comprising:
   a stage configured to mount a substrate;
   a ring member configured to secure an outer periphery of the substrate on the stage;
   a nozzle configured to supply a liquid on a surface of the substrate to reach a first height that causes a portion of the protrusion feature of the substrate to be exposed, wherein a height of the ring member is greater than the first height of the liquid;
   an imaging unit configured to capture an image including the liquid and the exposed portion of a protrusion feature of the substrate; and
   an arithmetic operator configured to determine a size of the exposed portion of the protrusion feature using the image, and determine a height of the protrusion feature based on the determined size of the exposed portion of the protrusion feature.

2. The inspection device according to claim 1, wherein the image obtained from the imaging unit is a two-dimensional image, and
   the arithmetic operator is further configured to determine the size of the exposed portion in the image based on a difference in color attribute between the liquid and the protrusion feature.

3. The inspection device according to claim 1, wherein the liquid has different color attributes for the surface of the substrate and the protrusion feature.

4. The inspection device according to claim 1, wherein the arithmetic operator is further configured to determine an area of the exposed portion of the protrusion feature in the image based on a number of pixels of the protrusion feature.

5. The inspection device according to claim 1, wherein a liquid repellant property of the protrusion feature is different from a liquid repellant property of the liquid.

6. The inspection device according to claim 1, wherein the arithmetic operator is further configured to determine whether the protrusion feature is defective based on comparing the determined height of the protrusion feature with a predetermined range.

7. An inspection device comprising:
a stage configured to mount a substrate;
a ring member configured to secure an outer periphery of the substrate on the stage;
a nozzle configured to supply a liquid on a surface of the substrate to reach a first height that causes a portion of the protrusion feature of the substrate to be exposed;
an imaging unit configured to capture an image including the liquid and the exposed portion of a protrusion feature of the substrate; and
an arithmetic operator configured to determine a size of the exposed portion of the protrusion feature using the image, and determine a height of the protrusion feature based on the determined size of the exposed portion of the protrusion feature,
wherein a liquid repellant property of the protrusion feature is different from a liquid repellant property of the liquid.

8. The inspection device according to claim 7, wherein the image obtained from the imaging unit is a two-dimensional image, and
the arithmetic operator is further configured to determine the size of the exposed portion in the image based on a difference in color attribute between the liquid and the protrusion feature.

9. The inspection device according to claim 7, wherein the liquid has different color attributes for the surface of the substrate and the protrusion feature.

10. The inspection device according to claim 7, wherein the arithmetic operator is further configured to determine an area of the exposed portion of the protrusion feature in the image based on a number of pixels of the protrusion feature.

11. The inspection device according to claim 7, wherein a height of the ring member is greater than the first height of the liquid.

12. The inspection device according to claim 7, wherein the arithmetic operator is further configured to determine whether the protrusion feature is defective based on comparing the determined height of the protrusion feature with a predetermined range.

13. An inspection device comprising:
a stage configured to mount a substrate;
a diaphragm, disposed above the substrate, that is configured to press a film, disposed on a surface of the substrate, to a first height to expose a portion of a protrusion feature of the substrate;
an imaging unit configured to capture an image including the film and the exposed portion of the protrusion feature; and
an arithmetic operator configured to determine a size of the exposed portion of the protrusion feature using the image obtained from the imaging unit, and determine a height of the protrusion feature based on the determined size of the exposed portion.

14. The inspection device according to claim 13, wherein the diaphragm is further configured to expand toward the substrate by at least one of: flowing a gas from a first side of the diaphragm opposite to a second side of the diaphragm facing the substrate or evacuating a chamber where the stage and the diaphragm are located.

15. The inspection device according to claim 13, wherein the film includes an epoxy-based resin film that allows the protrusion feature to penetrate.

16. The inspection device according to claim 13, wherein the arithmetic operator is further configured to determine the size of the exposed portion in the image based on a difference in color attribute between the film and the protrusion feature.

* * * * *